United States Patent
Toyoda et al.

(10) Patent No.: US 8,653,456 B2
(45) Date of Patent: Feb. 18, 2014

(54) PATTERN INSPECTION METHOD, PATTERN INSPECTION PROGRAM, AND ELECTRONIC DEVICE INSPECTION SYSTEM

(75) Inventors: Yasutaka Toyoda, Mito (JP); Tomohiro Funakoshi, Hitachinaka (JP); Takehiro Hirai, Ushiku (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/577,568

(22) PCT Filed: Feb. 9, 2011

(86) PCT No.: PCT/JP2011/052682
§ 371 (c)(1),
(2), (4) Date: Aug. 7, 2012

(87) PCT Pub. No.: WO2011/099490
PCT Pub. Date: Aug. 18, 2011

(65) Prior Publication Data
US 2012/0305767 A1    Dec. 6, 2012

(30) Foreign Application Priority Data
Feb. 9, 2010   (JP) .................................. 2010-026850

(51) Int. Cl.
*G01N 23/00* (2006.01)
*G21K 7/00* (2006.01)
(52) U.S. Cl.
USPC .......... 250/307; 250/306; 250/310; 250/311; 250/397; 250/399; 250/492.3

(58) Field of Classification Search
USPC ................ 250/306, 307, 310, 311, 397, 399, 250/492.3
See application file for complete search history.

(56) References Cited

U.S. PATENT DOCUMENTS

| 5,600,734 A | 2/1997 | Okubo et al. |
| 5,825,912 A | 10/1998 | Okubo et al. |

(Continued)

FOREIGN PATENT DOCUMENTS

| JP | 5-101166 A | 4/1993 |
| JP | 10-64469 A | 3/1998 |
| JP | 2002-319366 A | 10/2002 |
| JP | 2002-328015 A | 11/2002 |
| JP | 2008-267895 A | 11/2008 |
| JP | 2009-44070 A | 2/2009 |

OTHER PUBLICATIONS

International Search Report with English translation dated Apr. 5, 2011 (four (4) pages).
Form PCT/ISA/237 (three (3) pages).

*Primary Examiner* — Jack Berman
*Assistant Examiner* — Meenakshi Sahu
(74) *Attorney, Agent, or Firm* — Crowell & Moring LLP

(57) ABSTRACT

It is an object of the present invention to provide a technique capable of accurately inspecting a circuit pattern in which the contrast of an observation image is not clear, like a circuit pattern having a multilayer structure. A pattern inspection method according to the present invention divides a circuit pattern using the brightness of a reflection electron image and associates the region in the reflection electron image belonging to each division with the region in a secondary electron image.

18 Claims, 11 Drawing Sheets

(56) References Cited

U.S. PATENT DOCUMENTS

| | | | |
|---|---|---|---|
| 7,026,615 B2 * | 4/2006 | Takane et al. | 250/310 |
| 2002/0158199 A1 | 10/2002 | Takane et al. | |
| 2009/0002695 A1 * | 1/2009 | Saito et al. | 356/237.4 |
| 2009/0039261 A1 * | 2/2009 | Toyoda et al. | 250/310 |
| 2011/0129140 A1 * | 6/2011 | Kitazawa et al. | 382/149 |

* cited by examiner

Fig. 2
(a)
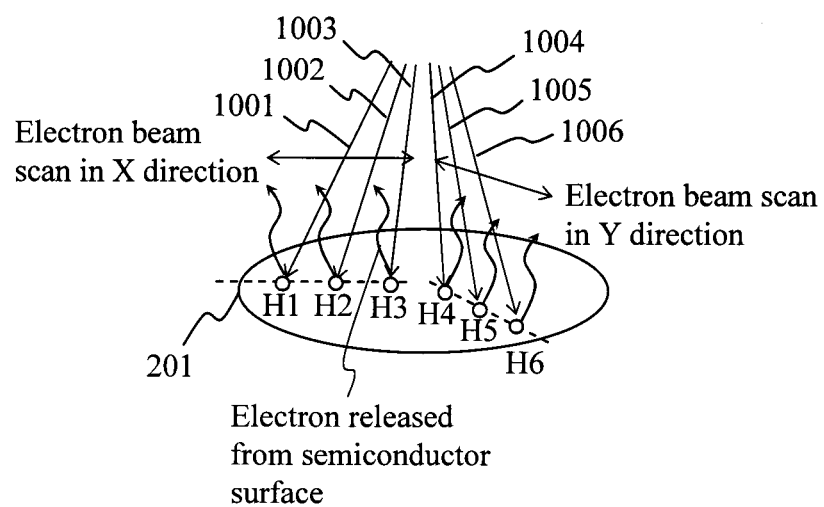
(b)
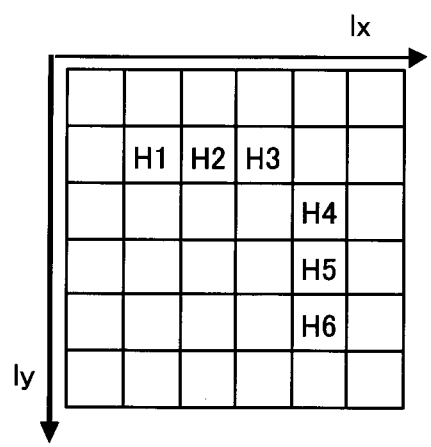

Fig. 5
(a)
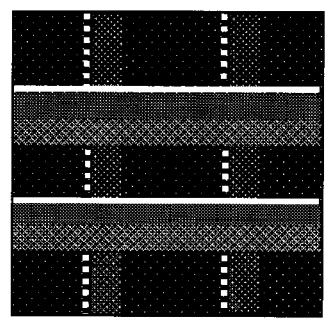
(b)
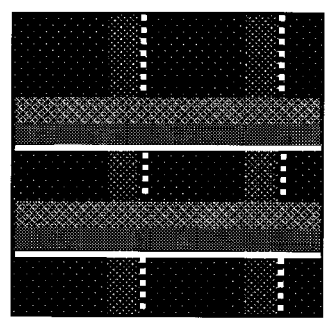
(c)
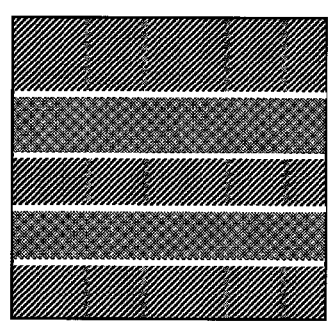

201a
201b
201c

Fig. 10
(a)
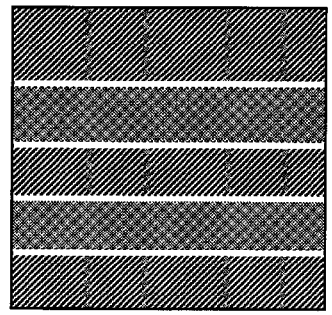
(b)
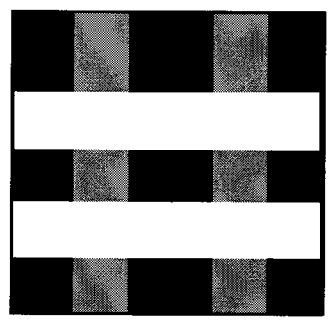
(c)
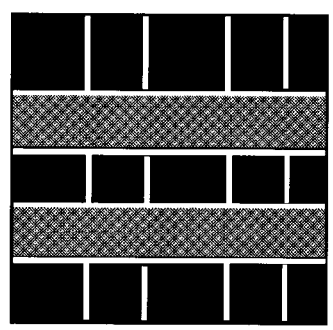

Fig. 12
(a)
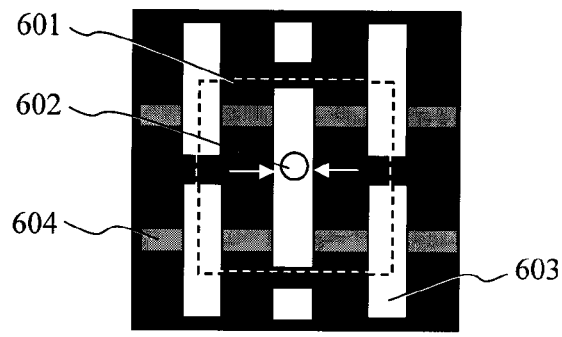
(b)
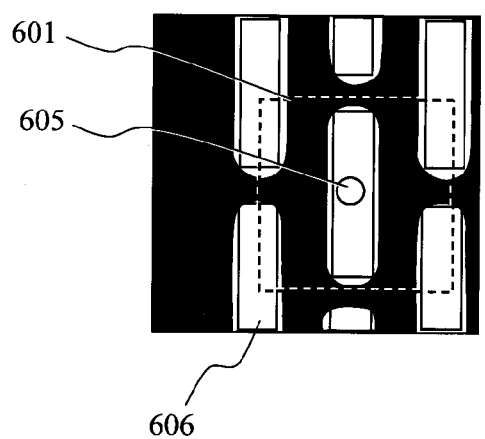
(c)
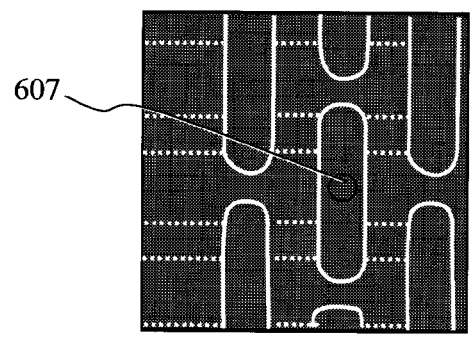

Fig. 13
(a)
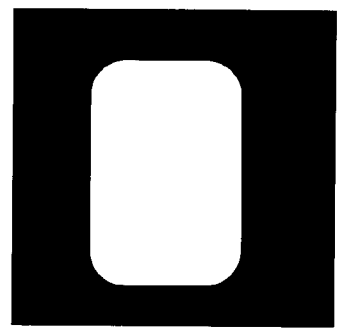
(b)
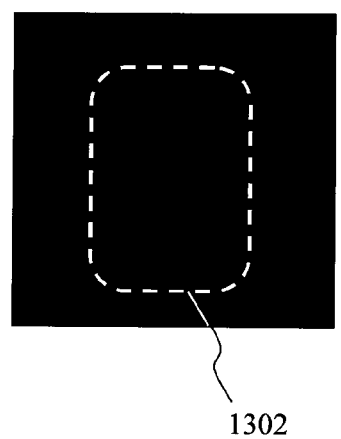
(c)
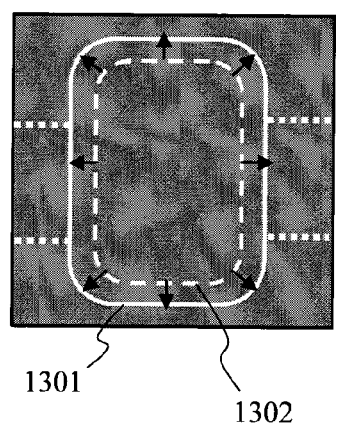

PATTERN INSPECTION METHOD, PATTERN INSPECTION PROGRAM, AND ELECTRONIC DEVICE INSPECTION SYSTEM

TECHNICAL FIELD

The present invention relates to a technique of inspecting a circuit pattern of an electronic device.

BACKGROUND ART

A recent electronic device has been refined and multilayered, furthermore, its logic has become complicated, and therefore the manufacturing process has become complicated. Accordingly, a defect due to the manufacturing process is generated, and therefore it is expected to efficiently and accurately inspect a circuit pattern of the electronic device. Especially, it is important to accurately inspect a circuit pattern with high and low points such as a hole having a high aspect ratio of the depth and bore diameter and a circuit having a multilayer structure.

For inspection of such a circuit pattern, apparatuses such as a CD-SEM (Critical Dimension Scanning Electron Microscope) and DR-SEM (Defect Review Scanning Electron Microscope) are used.

These apparatuses send a charged particle radiation such as an electron beam to a circuit pattern formed on a silicon wafer or reticle (mask), convert a secondary electron released from the circuit pattern into an image signal (hereinafter, referred to as "secondary electron image"), analyze the secondary electron image and inspect the circuit pattern.

To accurately inspect a circuit pattern, a secondary electron image that accurately reflects an actual circuit pattern image is required. However, in the above-noted circuit pattern with high and low points, it is difficult to complement a secondary electron released from a circuit pattern in a lower position. Therefore, the observation image contrast of a circuit pattern in a higher position may be degraded.

The following Patent Literature 1 suggests a method of correcting the contrast of a secondary electron image.

The following Patent Literatures 2 and 3 suggest a pattern matching method using a position determination image registered in advance, design data or data generated by a wafer manufacturing process simulation, as a template, in order to accurately specify a circuit pattern of an inspection target on a secondary electron image.

CITATION LIST

Patent Literature

Patent Literature 1: JP Patent Publication (Kokai) No. 2002-319366A
Patent Literature 2: JP Patent Publication (Kokai) No. H05-101166A (1993)
Patent Literature 3: JP Patent Publication (Kokai) No. 2002-328015A

SUMMARY OF INVENTION

Technical Problem

In the technique disclosed in Patent Literature 1 described above, the user needs to designate an image region used to analyze the contrast, which causes a burden. Also, in the case of inspecting many circuit patterns, it is difficult for the user to designate the above-noted image region to each circuit pattern.

In the techniques disclosed in Patent Literatures 2 and 3 described above, a circuit pattern having a multilayer structure is inspected using a secondary electron image. However, it is generally difficult to accurately distinguish between a circuit pattern on the upper side and a circuit pattern on the lower side, which are included in the secondary electron image. Therefore, it is difficult to accurately find an inspection position.

In addition to the above methods, it may be possible to correct the contrast of a secondary electron image based on brightness distribution of the entire image. However, since the circuit pattern on the upper side has a high contrast from the beginning, if the contrast is further corrected, the brightness becomes extremely high, which may cause the circuit pattern not to be identified.

The present invention is made to solve the above-noted problem and it is an object of the present invention to provide a technique of accurately inspecting a circuit pattern in which the contract of an observation image is not clear, like a circuit pattern having a multilayer structure.

Solution to Problem

A pattern inspection method according to the present invention divides a circuit pattern using the brightness of a reflection electron image and associates the region in the reflection electron image belonging to each division with a region in a secondary electron image.

Advantageous Effects of Invention

According to the pattern inspection method of the present invention, by dividing brightness values of a reflection electron image, it is possible to divide circuit patterns on the reflection electron image. Since the reflection electron image reflects a height direction shape of a multilayer structure well, it is considered that the contrast related to the height direction is better than a secondary electron image, and therefore it is considered that the above-described division represents a height direction shape of a circuit pattern well. By associating this reflection electron image and the secondary electron image, it is possible to accurately identify circuit patterns on the secondary electron image, so that it is possible to accurately inspect circuit patterns having a multilayer structure.

BRIEF DESCRIPTION OF DRAWINGS

FIG. 2 is a diagram illustrating a relationship between positions to which an electron beam 204 is irradiated on a silicon wafer 201 and an observation image.
FIG. 5 shows an example of a BSE image and an SE image.

FIG. 10 is a diagram showing a state where the contrast of an SE image is corrected in step S904.

FIG. 12 is a diagram showing correspondence relationships between design data, an upper part extraction image and an SE image.

FIG. 13 is a diagram showing processes of inspecting an outcome of a circuit pattern.

DESCRIPTION OF EMBODIMENTS

Embodiment 1

Figure 1:
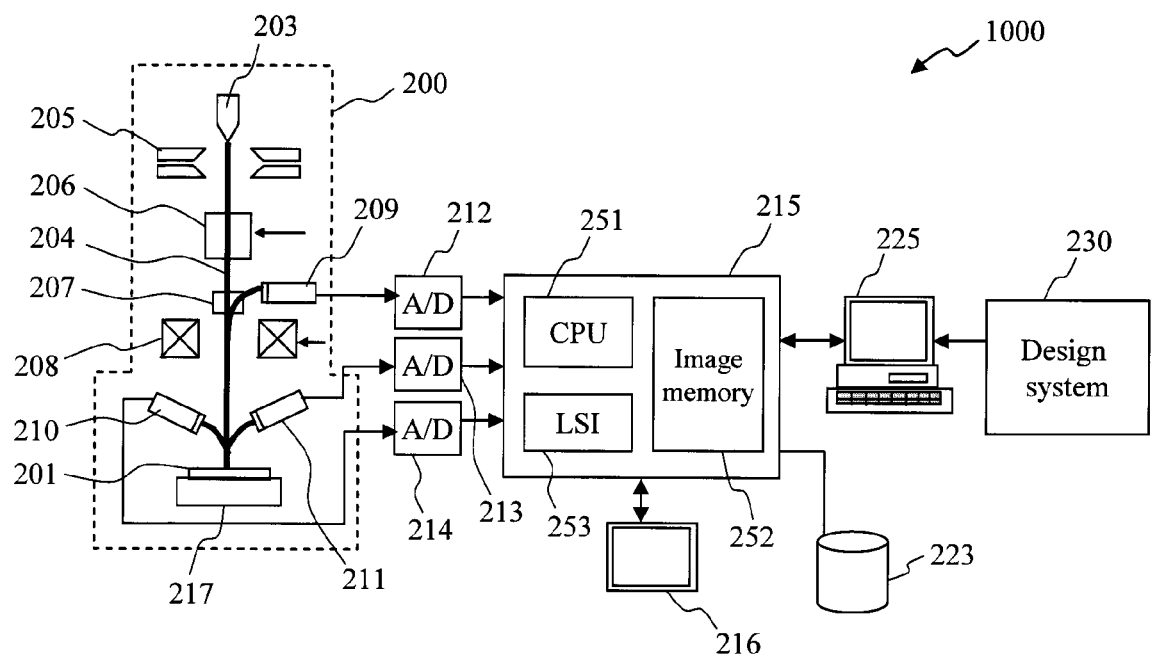
FIG. 1 is a configuration diagram of an electronic device inspection system 1000 according to Embodiment 1.

FIG. 1 is a configuration diagram of an electronic device inspection system 1000 according to Embodiment 1 of the present invention. The electronic device inspection system 1000 denotes a system of inspecting a circuit pattern of an electronic device such as a semiconductor device and has an electron optical system 200, a computing unit 215, an imaging recipe creation unit 225 and a design system 230. In the following, each component of the electronic device inspection system 1000 will be explained. It should be noted that, although a silicon wafer 201 is used as an example of an electronic device in the following explanation, it does not limit the invention.

The electron optical system 200 has an electron gun 203, a capacitor lens 205, a deflector 206, an ExB deflector 207, an objective lens 208, a secondary electron detector 209 and reflection electron detectors 210 and 211.

The electron gun 203 generates a charged particle radiation such as an electron beam (i.e., primary electron) 204. In the following, a case will be explained where the electron beam 204 is generated. The capacitor lens 205 causes the electron beam 204 generated from the electron gun 203 to converge. The deflector 206 deflects the convergent electron beam 204. The ExB deflector 207 deflects a secondary electron to the secondary electron detector 209. The objective lens 208 images the converged electron beam 204 on the silicon wafer 201.

The silicon wafer 201 is placed on an XY stage 217. The deflector 206 and the objective lens 208 control an irradiation position and diaphragm of the electron beam 204 such that the electron beam 204 is focused and irradiated in an arbitrary position on the silicon wafer 201 placed on the XY stage 217.

The XY stage 217 is configured such that it is possible to shifting the silicon wafer 201 and takes a photograph of an image in an arbitrary position of the silicon wafer 201. To change an observation position by the XY stage 217 refers to as "stage shift," and to deflect the electron beam 204 by the deflector 206 to change an observation position refers to as "beam shift."

A secondary electron and reflection electron are released from the silicon wafer 201 to which the electron beam 204 is irradiated, and the secondary electron is detected from the secondary electron detector 209. The reflection electron is detected by the reflection electron detectors 210 and 211. The reflection electron detectors 210 and 211 are placed in different positions, for example, in upper left and lower right positions of the silicon wafer 201 on the XY plane.

The secondary electron and the reflection electron detected in the secondary electron detector 209 and the reflection electron detectors 210 and 211 are converted into digital signals in A/D converters 212, 213 and 214.

The computing unit 215 controls operations of the above-described units. Also, it receives the detection result of each detector converted into a digital signal and stores the detection result in an image memory 252. In addition, it has a function as an observation image acquisition unit to generate a reflection electron image and a secondary electron image based on the detection result of each detector.

For example, a CPU (Central Processing Unit) 251 and image processing hardware 253 perform image processing based on an inspection object and inspects an electronic device. Data stored in the image memory 252 may be stored in an external storage apparatus 223 anew.

The computing unit 215 has a GUI (Graphical User Interface) to display, for example, an observation image or an inspection result for the user using a display 216 having an input unit.

Although FIG. 1 shows a configuration example providing two detectors for reflection electron images, the number of detectors may be three or more. Also, part or all of the control in the computing unit 215 may be processed after being assigned to, for example, an electronic computer having a CPU or a memory that can accumulate an image.

Further, the computing unit 215 is connected to the imaging recipe creation unit 225 via a network. The imaging recipe creation unit 225 creates imaging recipe data including a silicon wafer inspection coordinate required for inspection; a pattern matching template used to determine an inspection position; and an imaging condition.

In the case of using design data as a pattern matching template, the imaging recipe creation unit 225 is connected to a design system 230 via a network or the like in order to acquire the design data. The design system 230 denotes a system to perform an operation of designing an electronic device such as an EDA (Electronic Design Automation) tool.

The configuration of the electronic device inspection system 1000 has been described above. Next, a method of imaging a signal acquired by irradiating the electron beam 204 to the silicon wafer 201 will be explained.

FIG. 2 is a diagram illustrating relationships between positions to which the electron beam 204 is irradiated on the silicon wafer 201 and an observation image. For example, as shown in FIG. 2(a), the electron beam 204 is scanned and irradiated as shown in irradiation directions 1001 to 1003 along the "x" direction or irradiation directions 1004 to 1006 along the "y" direction. By changing the deflection direction of the electron beam 204, it is possible to change a scanning direction.

In FIG. 2, H1 to H3 represent positions in which the electron beam 204 scanned in the "x" directions 1001 to 1003 is irradiated on the silicon wafer 201. Similarly, H4 to H6 represent positions in which the electron beam 204 scanned in the "y" directions 1004 to 1006 is irradiated on the silicon wafer 201.

The signal amount of secondary electrons released in H1 to H6 each is converted to a pixel brightness value through the secondary electron detector 209 and an AD converter 212. Also, the signal amount of reflection electrons is similarly converted to a pixel brightness value via the reflection electron detectors 210 and 211 and the AD converters 213 and 214.

FIG. 2(b) is a diagram showing a state where each irradiation position of the electron beam 204 is associated with XY coordinates. Detection signals of the secondary electrons and reflection electrons are converted to brightness values of pixels H1 to H6. SE (Secondary Electron) images are generated from the secondary electron signal amounts and BSE (Back Scattered Electron) images are generated from the reflection electron signal amounts.

A method of imaging signals acquired by irradiating the electron beam 204 to the silicon wafer 201 has been described above. Next, operations of the electronic device inspection system 1000 will be explained.

Figure 3:
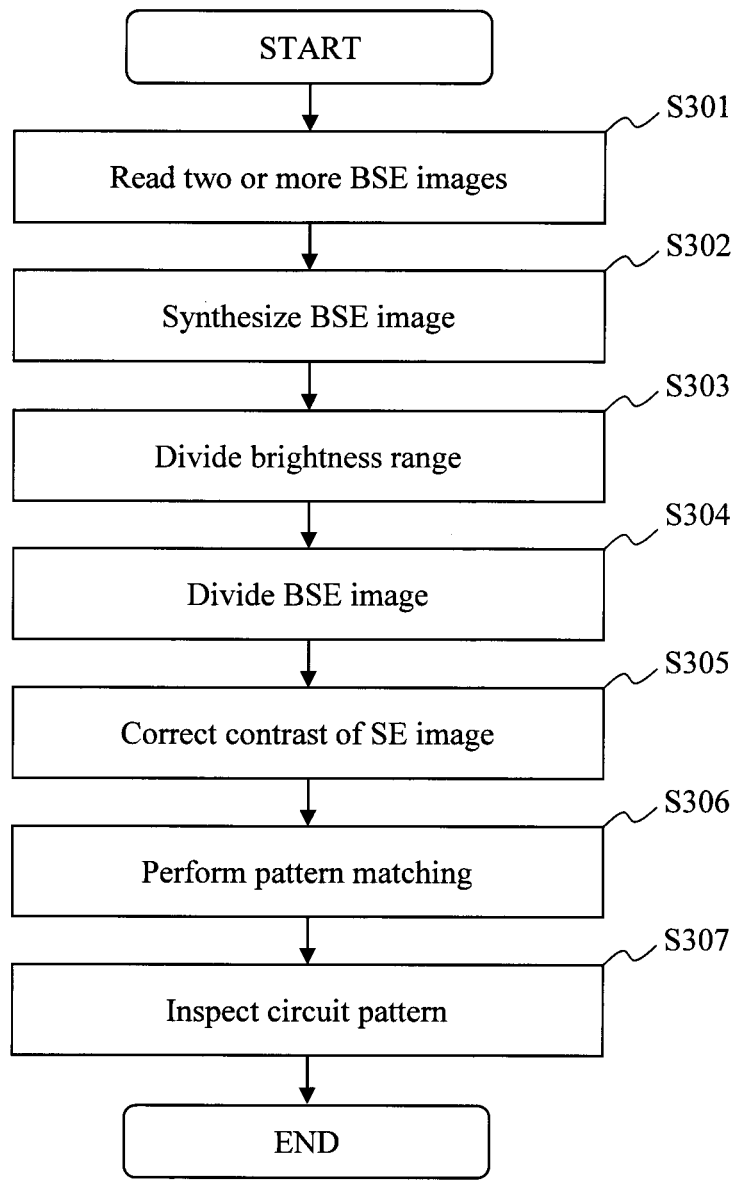
FIG. 3 is a diagram showing an operation flow of the electronic device inspection system 1000.

FIG. 3 is a diagram showing an operation flow of the electronic device inspection system 1000. In the following, each step of FIG. 3 will be explained. It should be noted that each step will be explained anew in detail using figures described below.

(FIG. 3: Step S301)

The computing unit 215 acquires detection results of the reflection electron detectors 210 and 211 and generates a BSE image for each detector. The number of reflection electron detectors is two in Embodiment 1, and therefore two BSE images are generated in the present step. A state of generating two BSE images is shown anew in FIGS. 4 and 5 described below.

(FIG. 3: Step S302)

The computing unit 215 combines the two BSE images generated in step S301. A state of generating the synthetic BSE image in the present step will be shown anew in FIG. 6 described later.

(FIG. 3: Step S303)

The computing unit 215 divides the pixel brightness values of the synthetic BSE image into two or more brightness ranges. To divide the brightness values means to express the brightness intensity by level such that, for example, when the brightness has a minimum value of 0 and a maximum value of 255, brightness values 0 to 85 belong to division 1, brightness values 86 to 170 belong to division 2 and brightness values 171 to 255 belong to division 3. The present step will be shown anew in detail in FIG. 7 described below. It should be noted that the above-described division and the brightness values are just an example for explanation.

(FIG. 3: Step S304)

The computing unit 215 divides the regions in the synthetic BSE image based on the result of step S303. For example, in the case of the example described in the above-described step S303, regions having the brightness values corresponding to the brightness value ranges of divisions 1 to 3 are divided on the synthetic BSE image. As a result, the synthetic BSE image is divided into three kinds of regions. Next, the computing unit 215 replaces the brightness value of each region in the synthetic BSE image with a representative brightness value (described later) and equalizes it. An example of an image (i.e., region identification image) generated in the present step will be shown anew in FIG. 8 described later.

(FIG. 3: Step S305)

The computing unit 215 corrects the contrast of SE images based on the result of step S304. To be more specific, the regions of synthetic BSE image divided as a result of step S304 are associated with the regions of SE image and the brightness of each region is corrected such that the boundary between the regions of the SE image can be easily identified. The present step will be explained anew in detail in FIGS. 9 and 10 described later.

(FIG. 3: Step S306)

The computing unit 215 performs pattern matching using template data such as design data and specifies an inspection position on the SE image.

(FIG. 3: Step S307)

The computing unit 215 inspects whether an expected circuit pattern is acquired in an inspection position on the SE image specified in step S306, by comparing circuit pattern shapes of the design data and SE image, for example.

Figure 4:
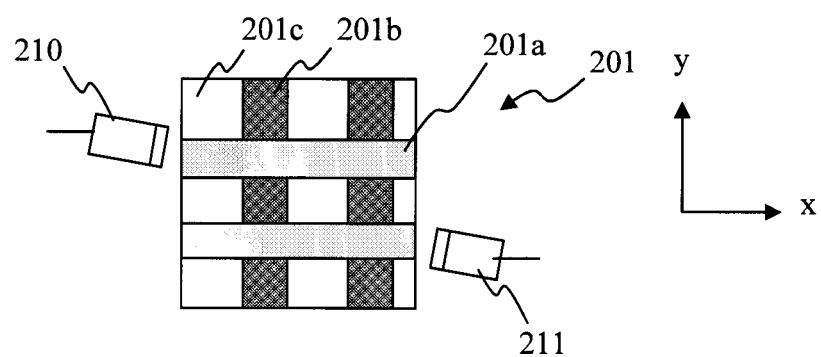
FIG. 4 is a diagram of the silicon wafer 201 and reflection electron detectors 210 and 211 seen from above.

FIG. 4 is a diagram of the silicon wafer 201 and reflection electron detectors 210 and 211 seen from above. The silicon wafer 201 has a multilayer structure. An upper part 201a is positioned above a lower part 201b (i.e., on a side closer to the reflection electron detectors). Also, a background part, that is, a pattern unformed part of the silicon wafer 201 is indicated by "201c".

The reflection electron detectors 210 and 211 are arranged in different positions on the XY plane of the silicon wafer 201 seen from the above. In the example of FIG. 4, the reflection electron detectors 210 and 211 are arranged in positions observed from the upper left and upper right on the XY plane of the silicon wafer 201. In step S301, the BSE image is acquired via each detector.

FIG. 5 shows examples of BSE images and SE image. FIG. 5(a) shows an example of a BSE image acquired via the reflection electron detector 210, FIG. 5(b) shows an example of a BSE image acquired via the reflection electron detector 211 and FIG. 5(c) shows an example of an SE image acquired via the secondary electron detector 209.

The BES images generated via the reflection electron detectors 210 and 211 generally have a higher brightness value in a pattern pixel in a higher position and a lower brightness value in a pattern pixel in a lower position. Therefore, in the BSE images shown in FIGS. 5(a) and 5(b), the image of the upper part 201a becomes bright and the image of the lower part 201b becomes dark. The image of the background part 201c becomes darker.

The reflection electron detector 210 detects a reflection electron from the upper left direction (on the XY plane) as shown in FIG. 4 so that it is possible to better detect the contrast of observation images seen from the left and above in concavity and convexity patterns of the silicon wafer 201. However, observation images seen from the right and below are behind the concavity and convexity patterns, and therefore the contrast of the BSE images tends to be lower.

Similarly, the reflection electron detector 211 detects a reflection electron from the lower right direction (on the XY plane) so that it is possible to better detect the contrast of observation images seen from the right and below in the concavity and convexity patterns of the silicon wafer 201, but observation images seen from the left and above become lower.

Thus, taken into account a characteristic that a BSE image denotes an observation image generated by detecting a reflection electron, it can be said that it reflects the concavity and convexity of a circuit pattern well.

One SE image is made by collecting secondary electrons released from the surface of the silicon wafer 201, which are acquired by irradiating the electron beam 204 to the silicon wafer 201, using an electrical field caused by the power voltage applied to the secondary electron detector 209, and imaging them. Therefore, it is possible to image the all-around edge used to inspect a circuit pattern without being influenced by pattern concavity and convexity unlike a BSE image.

However, in the case of taking a photograph of a circuit pattern with high and low points like a multilayer structure circuit, it is difficult to capture a secondary electron released from a circuit pattern in the lower position. Therefore, the SE image of the circuit pattern in the lower position has a lower contrast than that of the SE image of the circuit pattern in the higher position.

Figure 6:
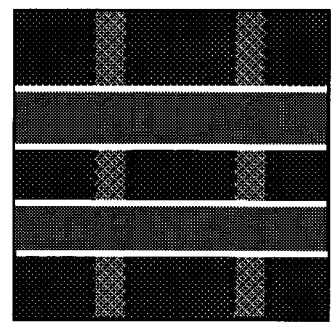
FIG. 6 is a diagram showing an example of a synthetic BSE image generated in step S302.

FIG. 6 is a diagram showing an example of the synthetic BSE image generated in step S302. The computing unit 215 combines a BSE image acquired via the reflection electron detector 210 and a BSE image acquired via the reflection electron detector 211 using, for example, the following method to generate a synthetic BSE image. By this means, it is possible to acquire a synthetic BSE image in which the convexity part of a circuit pattern has a high brightness value and the brightness of the concavity part is low.

(Synthetic BSE Image Generation: Method 1)

The computing unit 215 calculates a brightness average value of pixels in the same position of BSE images and provides this average value as a brightness value of a pixel in the same position of a synthetic BSE image.

(Synthetic BSE Image Generation: Method 2)

The computing unit 215 compares the brightness of pixels in the same position of BSE images to acquire the highest brightness value and provides this highest brightness value as a brightness value of a pixel in the same position of the synthetic BSE image.

Figure 7:
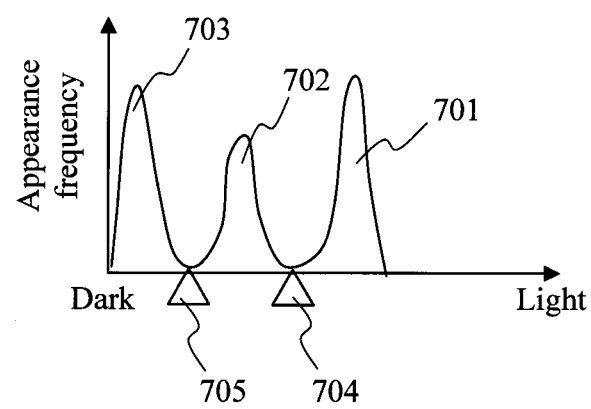
FIG. 7 is a diagram showing an example of a histogram indicating the brightness value of each pixel of a BSE image and its appearance frequency.

FIG. 7 is a diagram showing an example of a histogram indicating the brightness value of each pixel of a BSE image and its appearance frequency. Since the BSE image includes pixels having brightness corresponding to concavity and convexity patterns, frequency peaks corresponding to these patterns occur on the histogram. In the cases of the BSE images exemplified in FIGS. 4 to 6, a frequency peak 701 corresponding to the upper part 201*a*, a frequency peak 702 corresponding to the lower part 201*b* and a frequency peak 703 corresponding to the background part 201*c* are illustrated. The same applies to the synthetic BSE image.

As shown in FIG. 7, the frequency distribution trend of the histogram in which the frequency peak corresponding to the higher position, the frequency peak corresponding to the lower position and the frequency peak corresponding to the background occur, is a common feature in all BSE images acquired by imaging a pattern with high and low points.

In step S304, using the histogram as shown in FIG. 7, the computing unit 215 divides the brightness values of the synthetic BSE image into brightness ranges corresponding to the upper part 201*a*, the lower part 201*b* and the background part 201. In FIG. 7, it is assumed that the brightness value corresponding to the boundary between the upper part 201*a* and the lower part 201*b* is "704" and the brightness value corresponding to the boundary between the lower part 201*b* and the background part 201*c* is "705."

To be more specific, for example, the brightness value of the lowest frequency between the frequency peak 701 and the frequency peak 702 can be regarded as a brightness threshold 704 and the brightness value of the lowest frequency between the frequency peak 702 and the frequency peak 703 can be regarded as a brightness threshold 705.

In step S304, using these brightness values 704 and 705 as the threshold, the computing unit 215 divides each pixel of the synthetic BSE image into one of the divisions. Next, the computing unit 215 sets the brightness representative value of each brightness range. For example, it is assumed that the brightness value of the upper pattern 201*a* is 255, the brightness value of the lower pattern 201*b* is 128 and the brightness value of the background part 201*c* is 0. As these representative brightness values, for example, it is possible to use a brightness value of the highest appearance frequency in each division.

Next, the computing unit 215 generates an image in which the brightness value of each pixel of the synthetic BSE image is replaced with representative brightness values (hereinafter also called "region identification image"). By this means, the region identification image becomes an image having only three brightness values.

Since an actual BSE image includes noise through imaging process, even if the brightness of each pixel is replaced with the representative brightness value as described above, the noise may remain. In this case, by passing the region identification image through a smoothing filter and applying noise reduction processing, it is possible to suppress the noise influence. Also, before it is determined that in which division each pixel of the synthetic BSE image is included, the same noise reduction processing may be applied.

Figure 8:
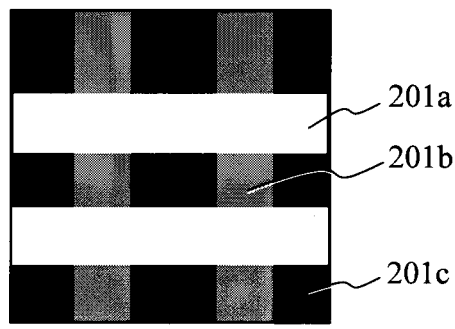
FIG. 8 is a diagram showing a state where the contrast of a synthetic BSE image is corrected.

FIG. 8 is a diagram showing a state where the contrast of a synthetic BSE image is corrected. In step S304, the computing unit 215 replaces the brightness of pixels belonging to the regions explained in FIG. 7 with representative brightness values and generates a region identification image having only the representative brightness values. By this means, the synthetic BSE image is an image having only three brightness values corresponding to the upper part 201*a*, the lower part 201*b* and the background part 201*c*.

Figure 9:
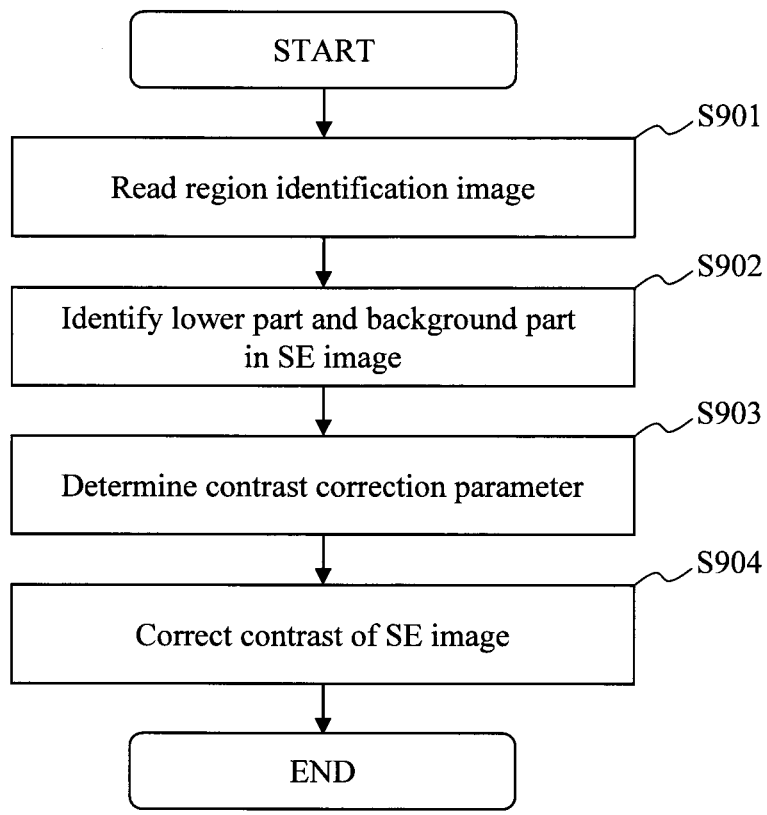
FIG. 9 is a diagram showing a detailed flow of step S305 in FIG. 3.

FIG. 9 is a diagram showing a detailed flow of step S305 in FIG. 3. Here, although a step of correcting the contrast of the lower part 201*b* and the background 201*c* is shown, steps of contrast correction in the other parts can similarly be performed. Each step in FIG. 9 will be explained below.

(FIG. 9: Step S901)

The computing unit 215 reads the region identification image generated in step S304.

(FIG. 9: Step S902)

The computing unit 215 overlaps the SE image and the region identification image and identifies the lower part 201*b* and the background 201*c* of the SE image. Since the region identification image shows the upper part 201*a*, the lower part 201*b* and the background part 201*c* with good contrast, by overlapping the region identification image and the SE image, it is easily possible to identify each region in the SE image. Regarding position correction in a case where the imaging positions of the SE image and the region identification image are shifted, it will be described later in Embodiment 2.

(FIG. 9: Step S903)

The computing unit 215 acquires the maximum brightness value and the minimum brightness value in each of the lower part 201*b* and the background part 201*c* in the SE image, and uses these values as contrast correction parameters.

(FIG. 9: Step S904)

The computing unit 215 corrects the maximum brightness values and minimum brightness values of the lower part 201*b* and the background part 201*c* in the SE image to "255" and "0," respectively, to clear the contrast. For example, it is possible to correct the brightness using a correction equation as shown in the following Equation 1.

[Expression 1]

$$Dst = \frac{255(Src - \min)}{\max - \min} \quad \text{(Equation 1)}$$

where

Src: brightness value before the SE image is corrected;
Dst: brightness value after the SE image is corrected;
max: maximum brightness value in the region to which Src pixel belongs; and
min: minimum brightness value in the region to which Src pixel belongs.

It should be noted that various contrast correction methods based on image brightness are proposed in addition to the above-noted method and a contrast correction method is not limited to Equation 1. Also, contrast correction parameters for each region may be designated by the user.

FIG. 10 is a diagram showing a state where the contrast of the SE image is corrected in step S904. FIG. 10(a) shows the SE image before correction, FIG. 10(b) shows the region identification image and FIG. 10(c) shows the SE image after correction. In the corrected SE image, the upper part 201a, the lower part 201b, the background part 201c and the contrast of the boundaries between these parts are clear.

As described above, in Embodiment 1, the computing unit 215 identifies the upper part 201a, the lower part 201b and the background part 201c of the circuit pattern using the BSE image and uses this identification result to correct the contrast of the SE image. Since the BSE image reflects the height of the circuit pattern well, compared to the case where the SE image is used as it is, it is possible to clarify concavity and convexity patterns of the circuit pattern better. Therefore, it is possible to correct the contrast such that the SE image shows the concavity and convexity of the circuit pattern more clearly and accurately so as to make it easier to inspect the circuit pattern using the SE image.

Also, in Embodiment 1, in step S304, the computing unit 215 divides brightness values into two or more brightness ranges (in Embodiment 1, three brightness ranges) based on the brightness appearance frequency in the BSE image, and equalizes the brightness by replacing the image region brightness included in each division with a representative brightness value (for example, the most frequent brightness value). By this means, the contrast of the image region included in each brightness range becomes clear, which makes it easier to identify the concavity and convexity of the circuit pattern.

Also, in Embodiment 1, using the region identification image generated by dividing the brightness range of the BSE image, the computing unit 215 identifies, for example, the upper part 201a in the SE image and further corrects the contrast such that the concavity and convexity patterns in the SE image becomes clear. By this means, it is possible to accurately inspect a circuit pattern with high and low points using the SE image.

Also, in Embodiment 1, the computing unit 215 synthesizes BSE images acquired via two or more reflection electron detectors and generate a synthetic BSE image. By this means, it is possible to clarify a BSE image of a shady part seen from the reflection electron detector.

Embodiment 2

In Embodiment 2 of the present invention, in a case where the imaging positions of the region identification image and the SE image are shifted in step S902, three correction methods for overlapping them will be explained. A configuration of the electronic device inspection system 1000 is the same as in Embodiment 1. In the following, differences from Embodiment 1 will be mainly explained.

Embodiment 2

Position Correction Method 1

(Step 1) The computing unit 215 performs secondary-differentiation edge detection processing on the region identification image as shown in FIG. 8.
(Step 2) The computing unit 215 extracts an edge part shown on an SE image.
(Step 3) By overlapping the edge part of the region identification image and the edge part of the SE image and, for example, adding a brightness value, the computing unit 215 evaluates the overlapping degree of the edge parts.
(Step 4) The computing unit 215 performs the same processing several times while changing the region size of the region identification image or the brightness value, specifies a position in which the overlapping degree of the edge parts is the largest, and corrects the position of the region identification image or the position of the SE image.

Embodiment 2

Position Correction Method 2

(Step 1) The computing unit 215 performs secondary-differentiation edge detection processing on the region identification image as shown in FIG. 8.
(Step 2) The computing unit 215 extracts an edge part shown on an SE image.
(Step 3) The computing unit 215 creates contour data of an edge part of the region identification image.
(Step 4) The computing unit 215 superposes the contour data on the SE image and uses an edge search method such as a snake method to search for a position in which the edge part on the SE image and the contour data overlap with each other, while moving or elongating and contracting the contour data.
(Step 5) The computing unit 215 corrects a position of the region identification image or a position of the SE image to the position in which the edge part on the SE image and the contour data overlap with each other.

Embodiment 2

Position Correction Method 3

As explained in Embodiment 1, in the case of dividing the brightness range of a BSE image and equalizing the brightness, the brightness of an edge part on the BSE is corrected and a position of the edge part may be shifted. However, in a case where a circuit pattern or a brightness correction method is known, the shift length of the edge part may also be known. Therefore, the shift length is stored in advance in an arbitrary storage apparatus. The computing unit 215 can read the shift length and correct a shift of the edge position of the region identification image or the SE image.

As described above, according to Embodiment 2, even in a case where the imaging positions of a region identification image and an SE image are shifted, it is possible to correct these shifts, precisely correlate the region identification image and the SE image and accurately perform contrast correction of the SE image.

Embodiment 3

In Embodiment 3 of the present invention, a method of specifying an inspection position on an SE image by pattern matching will be explained. This corresponds to step S306 in Embodiment 1. Regarding steps S301 to S305, it is possible to adopt the same methods as in Embodiments 1 and 2. A configuration of the electronic device inspection system 1000 is the same as in Embodiments 1 and 2. Differences from Embodiments 1 and 2 will be mainly explained below.

Figure 11:
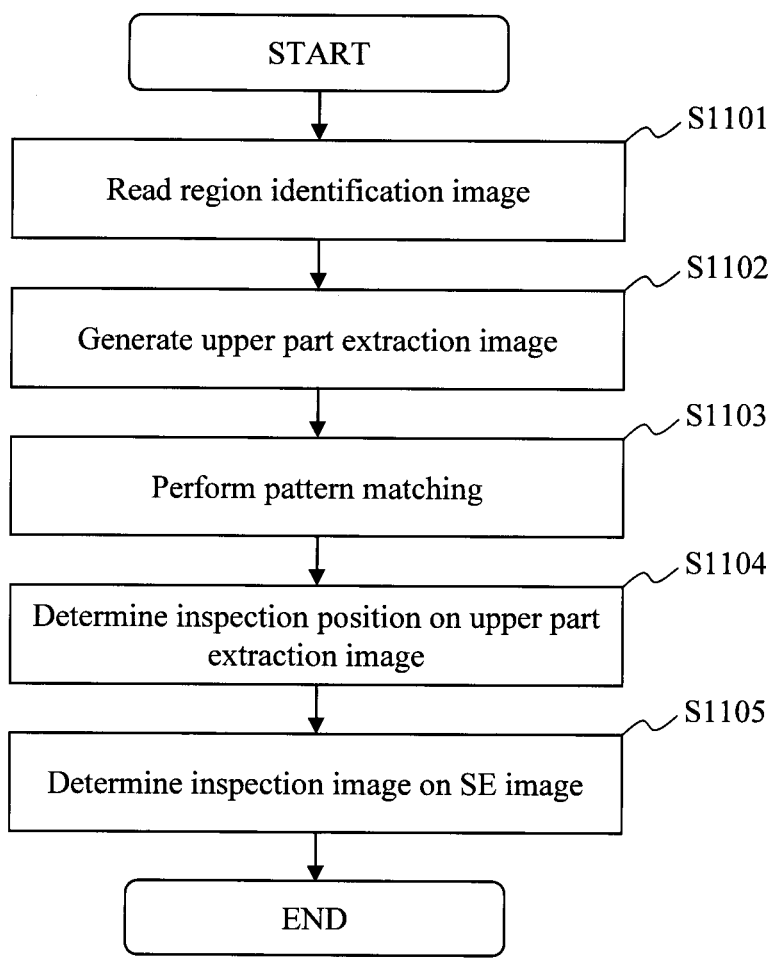
FIG. 11 is a diagram showing a processing flow specifying an inspection position on an SE image in Embodiment 3.

FIG. 11 is a diagram showing a processing flow specifying an inspection position on an SE image in Embodiment 3. The processing flow in FIG. 11 corresponds to step S306. In the following, each step in FIG. 11 will be explained.

(FIG. 11: Step S1101)

The computing unit 215 reads the region identification image generated in step S304.

(FIG. 11: Step S1102)

The computing unit 215 generates an upper part extraction image in which only a region corresponding to the upper part 201a in the region identification image is extracted. For example, in steps S304 to S305, the pixel brightness of the image region recognized as the upper part 201a is set to the maximum value and the pixel brightness in the other image regions is set to "0."

(FIG. 11: Step S1102: Supplement)

In the present step, the image of only the upper part 201a is generated in order to mitigate an influence given from an image of the lower part 201b (and the background part 201c) when performing pattern matching in subsequent steps. If the upper part 201a and the lower part 201b are shown on the region identification image, although it is essential to perform pattern matching with a circuit pattern of the upper part 201a, it is not possible to distinguish the circuit pattern of the upper part 201a from that of the lower part 201b, and therefore pattern matching may fail. Therefore, only the region corresponding to the upper part 201a is extracted. Similarly, when performing pattern matching of the lower part 201b, only a region corresponding to the lower part 201b may be extracted.

(FIG. 11: Step 1103)

The computing unit 215 performs pattern matching between the upper part extraction image and a template (for example, design data of the circuit pattern of an inspection target part) to search for an inspection target position. As a pattern matching method between a design pattern and an image, for example, a normalized correlation method or a generalized Hough transform is applicable, but it is not limited to these.

(FIG. 11: Step S1104)

The computing unit 215 specifies a position matching the template in step S1103, as an inspection position on the upper part extraction image.

(FIG. 11: Step S1105)

The computing unit 215 specifies a position on the SE image corresponding to the inspection position specified in step S1104, as an inspection position.

FIG. 12 is a diagram showing correspondence relationships between the design data, the upper part extraction image and the SE image. FIG. 12(a) shows the design data, FIG. 12(b) shows an image in which the upper part extraction image and the design data are overlapped, and FIG. 12(c) shows the SE image.

In FIG. 12(a), a partial region on the design data is selected as a template 601 used for pattern matching performed in step S1103. On the design data, positions of an upper part 603 and a lower part 604 are identified. The purpose of pattern matching is to search for a center 602 of the inspection position.

In step S1102, the computing unit 215 extracts only the upper part 606 of the region identification image and corrects the brightness of the other parts to "0." Also, in step S1104, matching between the upper part extraction image and the template 601 is performed to specify an overlapping part. The center position is specified as an inspection position 605 in the upper part extraction image.

In step S1105, the computing unit 215 specifies a position 607 on the SE image corresponding to the inspection position 605, as an inspection position on the SE image.

A method of specifying an inspection position on an SE image by pattern matching has been explained above. In Embodiment 3, although a case has been explained using a circuit pattern of a double-layered structure as an example, it is equally possible to acquire the same effect even in the case of a circuit pattern of a single-layered structure. This will be supplemented below.

Embodiment 3

Supplement

In the SE image, only an edge part of a circuit pattern is imaged as a pattern shape. Therefore, especially, in the case of inspecting a circuit pattern configured with only a simple line pattern and space pattern, it is difficult to judge whether the edge part of the SE image is the line pattern or it is the space pattern.

Meanwhile, in a BSE image, as described above, the concavity and convexity of a pattern are clearly shown as a luminance difference, and therefore a brightness histogram of a synthetic BSE image forms brightness distribution peaks for a line pattern and space pattern. By dividing these two peaks to generate a region identification image and performing pattern matching between an image generated by extracting a region determined as a convexity region and an image acquired by filling the line pattern of the SE image, it is possible to accurately specify an inspection position.

Embodiment 4

In Embodiment 4 of the present invention, a method of inspecting an outcome of a circuit pattern using an SE image will be explained. This corresponds to step S307 in Embodiment 1. Regarding steps S301 to S306, the same method as in Embodiments 1 to 3 can be adopted. A configuration of the electronic device inspection system 1000 is the same as in Embodiments 1 to 3. In the following, differences from Embodiments 1 to 3 will be mainly explained.

FIG. 13 is a diagram showing process of inspecting an outcome of a circuit pattern. FIG. 13(a) shows a region identification image of an inspection target pattern, FIG. 13(b) shows an image in which a contour line of FIG. 13(a) has been extracted, and FIG. 13(c) shows a state where the SE image and the contour line are compared.

In step S307, the computing unit 215 extracts a contour line showing the outline by an arbitrary method, from the region identification image of the circuit pattern of the inspection target. This contour line is represented by reference numeral "1302" in FIG. 13(b).

Next, the computing unit 215 superposes the contour line 1302 on the SE image. At this time, since the pattern matching in step S306 is completed and the inspection position is specified, the contour line 1302 and a circuit pattern 1301 on the SE image should ideally overlap. However, due to differences in the imaging conditions between the BSE image and the SE image, for example, a slight position shift may actually be caused at individual circuit pattern levels.

Therefore, the computing unit 215 searches for the circuit pattern 1301 on the SE image within a range in which the position shift in individual circuit patterns can be caused, using the contour line 1302 generated from the region identification image shown in FIG. 13(b) as the starting point. By this means, even at individual circuit pattern levels, it is possible to mitigate influences of the lower part 201b and the background part 201c and accurately specify an inspection position.

After specifying the circuit pattern 1301 on the SE image, the computing unit 215 compares a shape of the circuit patter 1301 and a shape of the circuit pattern on the design data to evaluate an outcome of the circuit pattern 1301. As an evaluation method, an arbitrary method can be used. For example, a method of comparing an area of the circuit pattern on the SE image and an area of the circuit pattern on the design data or a method of measuring an interval between the circuit pattern on the SE image and the circuit pattern on the design data is possible.

As described above, according to Embodiment 4, by specifying the contour line 1302 of a circuit pattern using a region identification image, even at individual circuit pattern levels, it is possible to mitigate influences of the lower part 201*b* and the background part 201*c* and accurately specify an inspection position. By this means, even at individual circuit pattern levels, it is possible to improve inspection accuracy.

Embodiment 5

Each processing flow, which was explained in Embodiments 1 to 4 and performed by the computing unit 215, can be mounted to hardware such as a circuit device that realizes the processing or implemented using software defining a computing apparatus such as a CPU 251 and a microcomputer and its operations.

REFERENCE SIGNS LIST

200: Electron optical system
201: Silicon wafer
201*a*: Upper part
201*b*: Lower part
201*c*: Background part
203: Electron gun
204: Electron beam
205: Capacitor lens
206: Deflector
207: ExB deflector
208: Objective lens
209: Secondary electron detector
210 and 211: Reflection electron detector
212 to 214: A/D converter
215: Computing unit
217: XY stage
223: Storage apparatus
225: Imaging recipe creation unit
230: Design system
251: CPU
252: Image memory
253: Image processing hardware
701 to 703: Frequency peak
704 and 705: Brightness value
1000: Electronic device inspection system
1001 to 1006: Scanning direction
1301: Circuit pattern
1302: Contour line

The invention claimed is:

1. A pattern inspection method for inspecting a circuit pattern of an electronic device, comprising:
   a step of acquiring a reflection electron image and a secondary electron image of the electron device;
   a division step of dividing a region in the reflection electron image based on brightness values of pixels of the reflection electron image;
   an association step of associating the region in the reflection electron image divided in the division step and a region in the secondary electron image; and
   an inspection step of inspecting a circuit pattern in the secondary electron image using a result in the association step.

2. The pattern inspection method according to claim 1, wherein
   the division step comprises dividing the brightness values of the pixels of the reflection electron image into two or more brightness value ranges and uniformly correcting brightness values of pixels included in a same division; and
   the association step comprises associating the region in the reflection electron image after the correction and the region in the secondary electron image.

3. The pattern inspection method according to claim 2, wherein the division step comprises dividing the brightness values of the pixels of the reflection electron image into the two or more brightness value ranges based on appearance frequencies of the brightness values and replacing brightness values of pixels belonging to respective divisions with brightness values having highest appearance frequencies in respective divisions.

4. The pattern inspection method according to claim 2, wherein the association step comprises correcting a brightness value of a pixel of the region in the secondary electron image corresponding to the region belonging to the division in the reflection electron image, so as to clarify a boundary with other regions.

5. The pattern inspection method according to claim 1, further comprising a step of generating a synthetic reflection electron image by acquiring reflection electrons in two or more different space positions, acquiring two or more reflection electron images and synthesizing the two or more reflection electron images,
   wherein the division step and the association step comprise using the synthetic reflection electron image instead of the reflection electron image.

6. The pattern inspection method according to claim 5 wherein, in the step of generating the synthetic reflection electron image, a maximum brightness value among brightness values of pixels in a same position of the two or more reflection electron images is adopted and set as a brightness value of a corresponding pixel of the synthetic reflection electron image, or an average value of brightness values of pixels in a same position of the two or more reflection electron images is set as a brightness value of a corresponding pixel of the synthetic reflection electron image.

7. The pattern inspection method according to claim 1, further comprising:
   a step of evaluating an overlapping degree between a boundary part of the region belonging to the division in the reflection electron image and a boundary part of the region in the secondary electron image; and
   a step of correcting a position of the reflection electron image or the secondary electron image such that the reflection electron image and the secondary electron image overlap in a position in which the overlapping degree is highest.

8. The pattern inspection method according to claim 1, further comprising:
   a step of detecting a boundary part of the region belonging to the division in the reflection electron image and creating contour data;
   a step of detecting a boundary part of the region in the secondary electron image; and
   a step of searching for a position in which the contour data in the reflection electron image and the boundary part in the secondary electron image overlap, and aligning positions of the reflection electron image and the secondary electron image.

9. The pattern inspection method according to claim 1, further comprising a step of correcting a position of the reflection electron image or the secondary electron image by a predetermined amount and aligning positions of the secondary electron image and the reflection electron image.

10. The pattern inspection method according to claim 4, wherein the association step comprises correcting brightness values of pixels of the secondary electron image by contrast correction or gamma correction of the pixels of the secondary electron image.

11. The pattern inspection method according to claim 1, wherein the association step comprises specifying an inspection position in the secondary electron image by performing pattern matching using an image of the region belonging to the division in the reflection electron image.

12. The pattern inspection method according to claim 11, wherein the association step comprises specifying an inspection position in the secondary electron image by performing pattern matching between the region belonging to the division in the reflection electron image and the circuit pattern on design data.

13. The pattern inspection method according to claim 11, further comprising a step of generating a synthetic reflection electron image by acquiring reflection electrons in two or more different space positions, acquiring two or more reflection electron images and synthesizing the two or more reflection electron images,
wherein the division step and the association step comprise using the synthetic reflection electron image instead of the reflection electron image.

14. The pattern inspection method according to claim 13, wherein, in the step of generating the synthetic reflection electron image, a maximum brightness value among brightness values of pixels in a same position of the two or more reflection electron images is adopted and set as a brightness value of a corresponding pixel of the synthetic reflection electron image, or an average value of brightness values of pixels in a same position of the two or more reflection electron images is set as a brightness value of a corresponding pixel of the synthetic reflection electron image.

15. The pattern inspection method according to claim 1, wherein the inspection step comprises inspecting the circuit pattern based on whether a shape of an edge part in the secondary electron image and a shape of contour data of the circuit pattern in design data are matched with each other.

16. The pattern inspection method according to claim 15, wherein the inspection step comprises searching for a position in which an edge part of a circuit pattern in an inspection target part of the reflection electron image and an edge part of a circuit pattern in an inspection target part of the secondary electron image overlap, and inspecting the circuit pattern on the secondary electron image in the position found as a result.

17. A pattern inspection program causing a computer to execute the pattern inspection method according to claim 1.

18. An electron device inspection apparatus comprising:
a charged particle sending unit that sends a charged particle radiation to an electronic device;
a reflection electron detector that detects a reflection electron generated from the electron device;
a secondary electron detector that detects a secondary electron generated from the electronic device;
an observation image acquiring unit that acquires a reflection electron image and a secondary electron image based on detection results in the reflection electron detector and the secondary electron detector; and
a computing unit that executes the pattern inspection method according to claim 1.

* * * * *